US010978427B2

(12) United States Patent
Li et al.

(10) Patent No.: US 10,978,427 B2
(45) Date of Patent: Apr. 13, 2021

(54) STACKED SEMICONDUCTOR DIE ASSEMBLIES WITH PARTITIONED LOGIC AND ASSOCIATED SYSTEMS AND METHODS

(71) Applicant: Micron Technology, Inc., Boise, ID (US)

(72) Inventors: Jian Li, Boise, ID (US); Steven K. Groothuis, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 20 days.

(21) Appl. No.: 16/592,420

(22) Filed: Oct. 3, 2019

(65) Prior Publication Data

US 2020/0075555 A1 Mar. 5, 2020

Related U.S. Application Data

(63) Continuation of application No. 14/242,485, filed on Apr. 1, 2014, now abandoned.

(51) Int. Cl.
*H01L 25/065* (2006.01)
*H01L 25/00* (2006.01)
(Continued)

(52) U.S. Cl.
CPC ........... *H01L 25/0657* (2013.01); *G11C 7/04* (2013.01); *H01L 25/0652* (2013.01); *H01L 25/18* (2013.01); *H01L 25/50* (2013.01); *G11C 2207/107* (2013.01); *H01L 23/3675* (2013.01); *H01L 23/49827* (2013.01); *H01L 23/49833* (2013.01); *H01L 24/13* (2013.01); *H01L 24/16* (2013.01); *H01L 24/17* (2013.01); *H01L 24/32* (2013.01); *H01L 24/73* (2013.01);
(Continued)

(58) Field of Classification Search
None
See application file for complete search history.

(56) References Cited

U.S. PATENT DOCUMENTS 8,546,955 B1 10/2013 Wu et al.
8,681,524 B1 3/2014 Stephens et al.
(Continued)

FOREIGN PATENT DOCUMENTS

JP 2011081885 A 4/2011
TW 201225249 A 6/2012
(Continued)

OTHER PUBLICATIONS

CN Patent Application No. 201580027138.3—Chinese Office Action and Search Report, dated May 24, 2018, with English Translation, 30 pages.
(Continued)

*Primary Examiner* — Erik Kielin
(74) *Attorney, Agent, or Firm* — Perkins Coie LLP

(57) ABSTRACT

Stacked semiconductor die assemblies having memory dies stacked between partitioned logic dies and associated systems and methods are disclosed herein. In one embodiment, a semiconductor die assembly can include a first logic die, a second logic die, and a thermally conductive casing defining an enclosure. The stack of memory dies can be disposed within the enclosure and between the first and second logic dies.

20 Claims, 8 Drawing Sheets

(51) Int. Cl.
*H01L 25/18* (2006.01)
*G11C 7/04* (2006.01)
*H01L 23/498* (2006.01)
*H01L 23/367* (2006.01)
*H01L 23/00* (2006.01)

(52) U.S. Cl.
CPC .............. *H01L 2224/0401* (2013.01); *H01L 2224/1319* (2013.01); *H01L 2224/13025* (2013.01); *H01L 2224/13111* (2013.01); *H01L 2224/13124* (2013.01); *H01L 2224/13147* (2013.01); *H01L 2224/13155* (2013.01); *H01L 2224/16146* (2013.01); *H01L 2224/16227* (2013.01); *H01L 2224/17181* (2013.01); *H01L 2224/32145* (2013.01); *H01L 2224/32225* (2013.01); *H01L 2224/32245* (2013.01); *H01L 2224/73203* (2013.01); *H01L 2224/73204* (2013.01); *H01L 2224/73253* (2013.01); *H01L 2225/06513* (2013.01); *H01L 2225/06517* (2013.01); *H01L 2225/06541* (2013.01); *H01L 2225/06555* (2013.01); *H01L 2225/06589* (2013.01); *H01L 2924/1033* (2013.01); *H01L 2924/10253* (2013.01); *H01L 2924/1431* (2013.01); *H01L 2924/1434* (2013.01); *H01L 2924/15311* (2013.01); *H01L 2924/1659* (2013.01); *H01L 2924/16152* (2013.01); *H01L 2924/16235* (2013.01); *H01L 2924/16251* (2013.01); *H01L 2924/16747* (2013.01); *H01L 2924/16787* (2013.01)

(56) References Cited

U.S. PATENT DOCUMENTS

| | | |
|---|---|---|
| 2005/0045855 A1 | 3/2005 | Tonapi et al. |
| 2006/0275952 A1 | 12/2006 | Gowda et al. |
| 2007/0290333 A1 | 12/2007 | Saini et al. |
| 2008/0042142 A1 | 2/2008 | Sugawara et al. |
| 2008/0301379 A1* | 12/2008 | Pong ................ G06F 12/0692 711/148 |
| 2009/0103855 A1 | 4/2009 | Binkert et al. |
| 2010/0052111 A1 | 3/2010 | Urakawa et al. |
| 2011/0037158 A1 | 2/2011 | Youn et al. |
| 2011/0087811 A1 | 4/2011 | Kondo et al. |
| 2011/0193229 A1 | 8/2011 | Ma et al. |
| 2012/0007229 A1 | 1/2012 | Bartley et al. |
| 2012/0038057 A1 | 2/2012 | Bartley et al. |
| 2012/0049347 A1 | 3/2012 | Wang |
| 2012/0074559 A1 | 3/2012 | Budell et al. |
| 2012/0146207 A1 | 6/2012 | Chou et al. |
| 2013/0003480 A1 | 1/2013 | D'Abreu et al. |
| 2013/0069215 A1 | 3/2013 | Nakao et al. |
| 2013/0119527 A1 | 5/2013 | Luo et al. |
| 2013/0119528 A1 | 5/2013 | Groothuis et al. |
| 2013/0234320 A1 | 9/2013 | Lu et al. |
| 2014/0040698 A1 | 2/2014 | Loh et al. |
| 2015/0035134 A1* | 2/2015 | Hung ...................... H01L 24/32 257/712 |
| 2015/0035135 A1 | 2/2015 | Hung et al. |
| 2015/0108628 A1 | 4/2015 | Yu et al. |
| 2015/0137345 A1 | 5/2015 | Choi et al. |
| 2016/0056101 A1 | 2/2016 | Jee et al. |

FOREIGN PATENT DOCUMENTS

| | | |
|---|---|---|
| TW | M435042 U | 8/2012 |
| WO | 2010126463 A1 | 11/2010 |
| WO | 2012061633 A2 | 5/2012 |
| WO | 2013074454 A2 | 5/2013 |
| WO | 2013074484 A2 | 5/2013 |
| WO | 2013119309 A1 | 8/2013 |

OTHER PUBLICATIONS

CN Patent Application No. 201580027138.3—Chinese Office Action, dated Apr. 15, 2019, with English Translation, 14 pages.
EP Patent Application No. 15772304.0—Examination Report, dated Jun. 21, 2019, 7 pages.
EP Patent Application No. 15772304.0—Extended European Search Report, dated Aug. 18, 2017, 10 pages.
JP Patent Application No. 2016-559523—apanese Office Action and Search Report, dated Apr. 3, 2018, with English Translation, 11 pages.
JP Patent Application No. 2016-559523—Japanese Office Action and Search Report, dated Sep. 5, 2017, with English Translation, 13 pages.
KR Patent Application No. 10-2016-7030096—Korean Office Action, dated Sep. 18, 2017, with English Translation, 23 pages.
KR Patent Application No. 10-2019-7008435—Korean Office Action, dated Jun. 18, 2019, with English Translation, 8 pages.
"Goering, Richard. Wide I/O 2, Hybrid Memory Cube (HMC)—Memory Models Advance 3D-IC Standards. Aug. 6, 2013. <URL: http://www.cadence.com/Community/blogs/ii/archive/2013/08/06/wide-i-o-2-hybrid-memory-cube-hmc-memory-models-advance-3d-ic-standards.aspx".
"International Search Report and Written Opinion dated Jul. 14, 2015 in International Application No. PCT/US2015/023677, 17 pages."
"Jeddeloh, J. et al., "Hybrid Memory Cube New DRAM Architecture Increases Density and Performance," IEEE 2012 Symposium on VLSI Technology Digest of Technical Papers, pp. 87-88, Jun. 2012, DOI: 10.1109/VLSIT.2012.6242474."
"Knight, S., "Micron now sampling speedy 2GB Hybrid Memory Cubes," TechSpot Technology News and Analysis, Sep. 26, 2013, 4 pages, URL: <http://www.techspot.com/news/54145-micron-now-sampling-speedy-2gb-hybrid-memory-cubes.html>."
"Office Action dated Feb. 14, 2017 in Taiwan Application No. 104110126, 27 pages."
"Office Action dated May 5, 2016 in Taiwan Application No. 104110126, 22 pages."
JP Patent Application No. 2018-223353—Japanese Office Action and Search Report, dated Jan. 7, 2020, with English Translation, 8 pages.

* cited by examiner

STACKED SEMICONDUCTOR DIE ASSEMBLIES WITH PARTITIONED LOGIC AND ASSOCIATED SYSTEMS AND METHODS

CROSS-REFERENCE TO RELATED APPLICATION(S)

This application is a continuation of U.S. patent application Ser. No. 14/242,485, filed Apr. 1, 2014, and titled "STACKED SEMICONDUCTOR DIE ASSEMBLIES WITH PARTITIONED LOGIC AND ASSOCIATED SYSTEMS AND METHODS," which is incorporated herein by reference in its entirety.

TECHNICAL FIELD

The disclosed embodiments relate to semiconductor die assemblies and to managing heat within such assemblies. In particular, the present technology relates to die assemblies having memory dies stacked between partitioned logic dies.

BACKGROUND

Packaged semiconductor dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry.

Semiconductor manufacturers continually reduce the size of die packages to fit within the space constraints of electronic devices, while also increasing the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias (TSVs).

The heat generated by the individual dies in vertically stacked die packages is difficult to dissipate, which increases the operating temperatures of the individual dies, the junctions therebetween, and the package as a whole. This can cause the stacked dies to reach temperatures above their maximum operating temperatures ($T_{max}$) in many types of devices and especially as the density of the dies in the package increases.

DETAILED DESCRIPTION

Specific details of several embodiments of stacked semiconductor die assemblies having memory dies stacked between partitioned logic dies and associated systems and methods are described below. The term "semiconductor die" generally refers to a die having integrated circuits or components, data storage elements, processing components, and/or other features manufactured on semiconductor substrates. For example, semiconductor dies can include integrated circuit memory and/or logic circuitry. Semiconductor dies and/or other features in semiconductor die packages can be said to be in "thermal contact" with one another if the two structures can exchange energy through heat. A person skilled in the relevant art will also understand that the technology may have additional embodiments, and that the technology may be practiced without several of the details of the embodiments described below with reference to FIGS. 1-7.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations.

Figure 1:
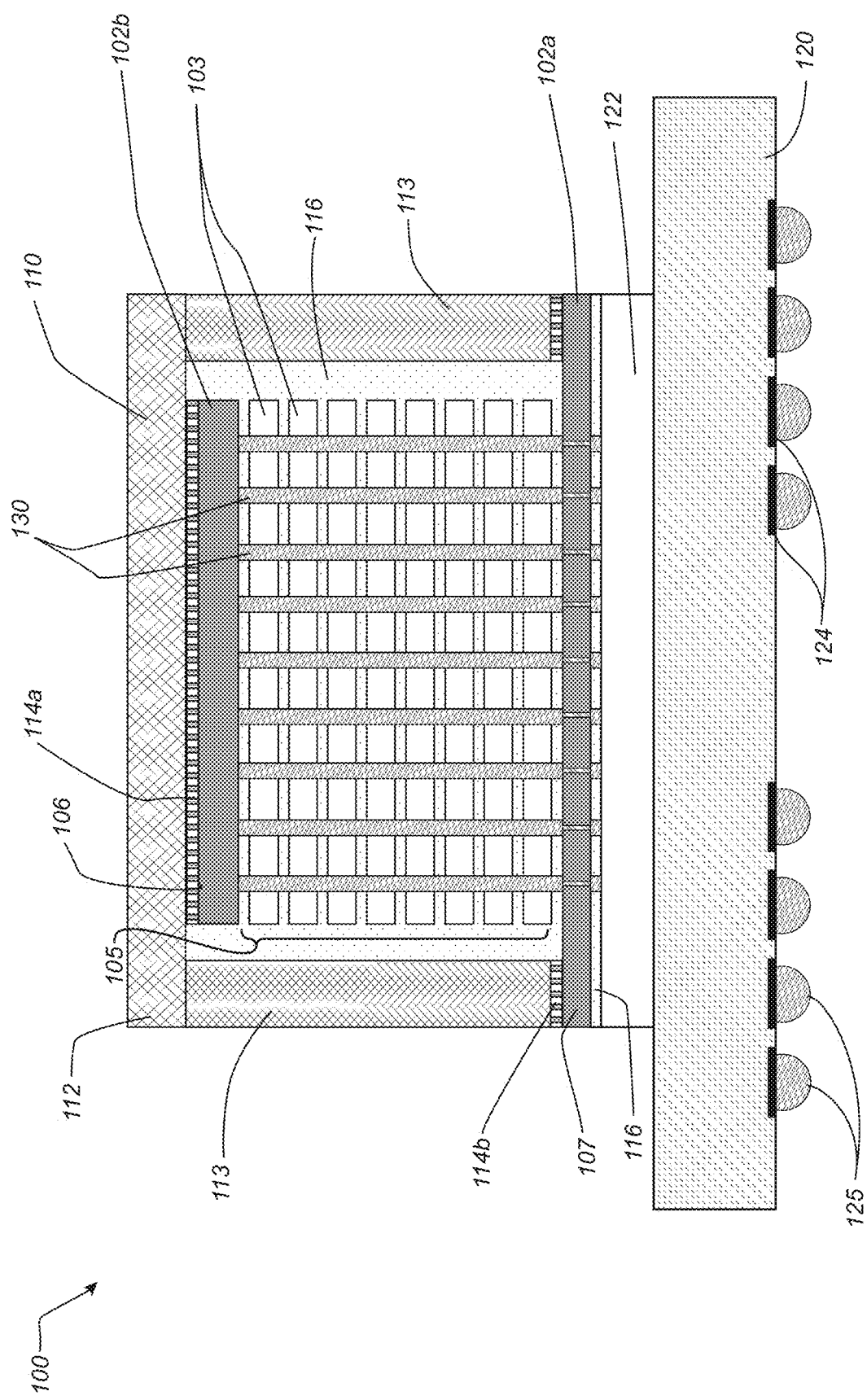
FIG. 1 is a cross-sectional view of a semiconductor die assembly configured in accordance with an embodiment of the present technology.

FIG. 1 is a cross-sectional view of a semiconductor die assembly 100 ("assembly 100") configured in accordance with an embodiment of the present technology. As shown, the assembly 100 includes a first logic die 102a, a second logic die 102b (collectively "logic dies 102"), and a plurality of memory dies 103 arranged in a stack 105 ("memory die stack 105") between the logic dies 102. The first logic die 102a is electrically coupled to a package substrate 120 by an interposer 122. The interposer 122 can include, for example, a semiconductor die, a dielectric spacer, and/or other suitable substrate having electrical connectors (e.g., vias, metal traces, etc.) connected between the interposer 122 and the package substrate 120. The package substrate 120 can include, for example, an interposer, a printed circuit board, or other suitable substrate connected to package contacts 124 (e.g., bond pads) and electrical connectors 125 (e.g., solder bumps) that electrically couple the assembly 100 to external circuitry (not shown). In some embodiments, the package substrate 120 and/or the interposer 122 can be configured differently. For example, in some embodiments the interposer 122 can be omitted and the first logic die 102a can be directly connected to the package substrate 120.

The first and second logic dies 102a and 102b are coupled to a plurality of through-stack interconnects 130 extending through the memory die stack 105. In the illustrated embodiment of FIG. 1, the through-stack interconnects 130 are shown as generally vertical, singular structures for purposes of illustration. However, each of the through-stack interconnects 130 can be composed of a combination of vertically and/or laterally arranged conductive elements interconnected to one another throughout the memory die stack 105. For example, each of the through-stack interconnects 130 can include an arrangement of interconnected conductive pillars, vias, through-die vias, solder bumps, metal traces, etc.

The assembly 100 further includes a thermally conductive casing 110 at least partially enclosing the second logic die 102b and the memory die stack 105 within an enclosure (e.g., a cavity). In the illustrated embodiment, the casing 110 includes a cap portion 112 and a wall portion 113 attached to or integrally formed with the cap portion 112. The cap portion 112 can be attached to a back side portion 106 of the second logic die 102b by a first interface material 114a (e.g., an adhesive). The wall portion 113 can extend vertically away from the cap portion 112 and be attached to a peripheral portion 107 of the first logic die 102a (known to those skilled in the art as a "porch" or "shelf") by a second interface material 114b (e.g., an adhesive). In addition to providing a protective covering, the casing 110 also provides a heat spreader to absorb and dissipate thermal energy away from the logic and memory dies 102 and 103. The casing 110 can accordingly be made from a thermally conductive material, such as nickel, copper, aluminum, ceramic materials with high thermal conductivities (e.g., aluminum nitride), and/or other suitable thermally conductive materials.

In some embodiments, the first interface material 114a and/or the second interface material 114b can be made from what are known in the art as "thermal interface materials" or "TIMs", which are designed to increase the thermal contact conductance at surface junctions (e.g., between a die surface and a heat spreader). TIMs can include silicone-based greases, gels, or adhesives that are doped with conductive materials (e.g., carbon nano-tubes, solder materials, diamond-like carbon (DLC), etc.), as well as phase-change materials. In some embodiments, for example, the thermal interface materials can be made from X-23-7772-4 TIM manufactured by Shin-Etsu MicroSi, Inc. of Phoenix, Ariz., which has a thermal conductivity of about 3-4 W/m° K. In other embodiments, the first interface material 114a and/or the second interface material 114b can include other suitable materials, such as metals (e.g., copper) and/or other suitable thermally conductive materials.

The logic dies 102 and/or the memory dies 103 can be at least partially encapsulated in a dielectric underfill material 116. The underfill material 116 can be deposited or otherwise formed around and/or between some or all of the dies of the assembly 100 to enhance the mechanical connection between the dies and/or to provide electrical isolation between, e.g., interconnects or other conductive structures between the dies. The underfill material 116 can be a non-conductive epoxy paste (e.g., XS8448-171 manufactured by Namics Corporation of Niigata, Japan), a capillary underfill, a non-conductive film, a molded underfill, and/or include other suitable electrically-insulative materials. In several embodiments, the underfill material 116 can be selected based on its thermal conductivity to enhance heat dissipation through the dies of the assembly 100. In some embodiments, the underfill material 116 can be used in lieu the first interface material 114a and/or the second interface material 114b to attach the casing 110 to the first logic die 102a and/or the second logic die 102b.

The logic and memory dies 102 and 103 can each be formed from a semiconductor substrate, such as silicon, silicon-on-insulator, compound semiconductor (e.g., Gallium Nitride), or other suitable substrate. The semiconductor substrate can be cut or singulated into semiconductor dies having any of variety of integrate circuit components or functional features, such as dynamic random-access memory (DRAM), static random-access memory (SRAM), flash memory, other forms of integrated circuit devices, including memory, processing circuits, imaging components, and/or other semiconductor devices. In selected embodiments, the assembly 100 can be configured as a hybrid memory cube (HMC) in which the memory dies 103 provide data storage (e.g., DRAM dies) and the logic dies 102 collectively provide memory control (e.g., DRAM control) within the HMC. In some embodiments, the assembly 100 can include other semiconductor dies in addition to and/or in lieu of one or more of the logic dies 102 and the memory dies 103. For example, such semiconductor dies can include integrated circuit components other than data storage and/or memory control components. Further, although the assembly 100 includes ten dies stacked on the interposer 122, in other embodiments the assembly 100 can include fewer than ten dies (e.g., six dies) or more than ten dies (e.g., twelve dies, fourteen dies, etc.). For example, in one embodiment, the assembly 100 can include two logic dies stacked on top of four memory dies and a single logic die stacked below the four memory dies. Also, in various embodiments, the logic dies 102 and the memory dies 103 can have different sizes. For example, in some embodiments the first logic die 102a can have the same footprint than the memory die stack 105 and/or the second logic die 102b can have a smaller or larger footprint than the memory die stack 105.

Figure 2A:
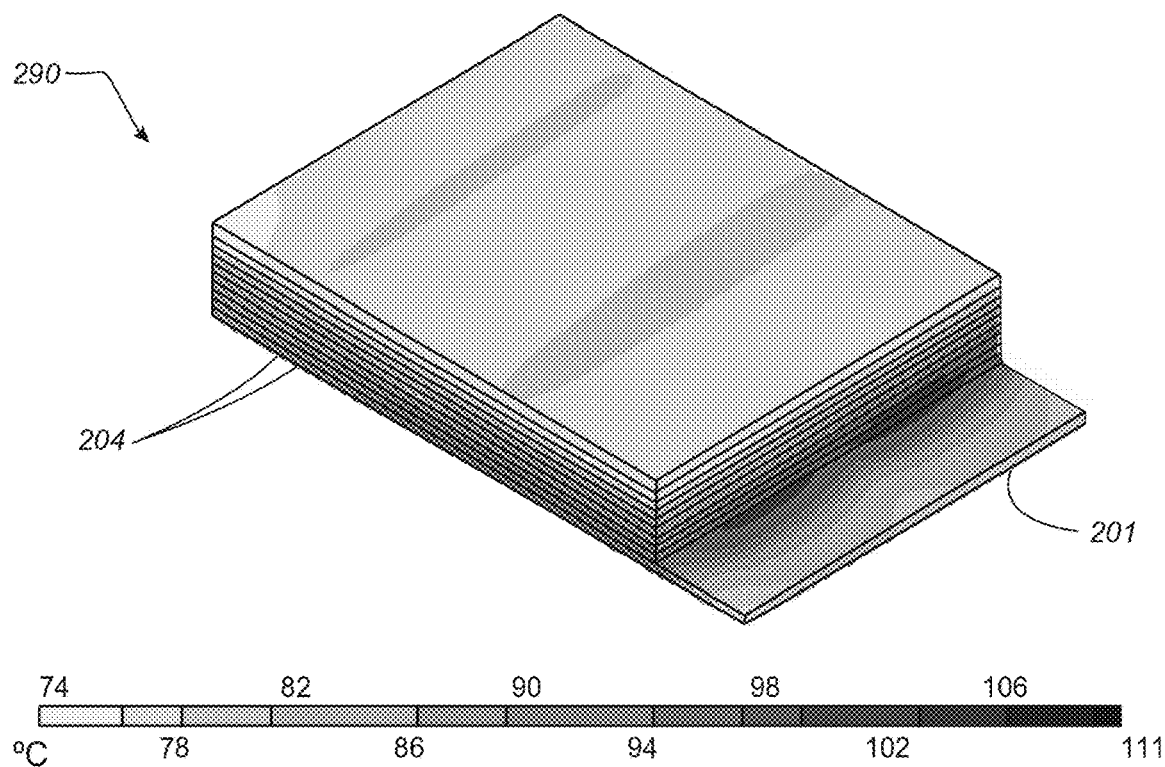
FIG. 2A is an isometric view illustrating a temperature profile of a HMC assembly during operation.

In general, the heat produced by a logic die can be significantly greater than the heat collectively produced by memory dies. For instance, a logic die in a conventional HMC assembly can consume 80% of the overall power during operation. A conventional semiconductor die assembly typically includes a single logic die positioned toward the bottom of the assembly. This means that during operation heat from the logic die must transfer through the memory dies en route to the casing of the assembly. Because the heat transfers through the memory dies, this increases the overall temperature of the assembly. FIG. 2A, for example, is an isometric view illustrating a temperature profile of a HMC assembly 290 during operation. As shown, the HMC assembly 290 includes stacked memory dies 204 and a single, underlying logic die 201. During operation, the high temperature of the logic die 201 concentrates thermal energy toward the bottom of the assembly 290. For example, the logic die 201 has a maximum operating temperature of about 111° C., while the memory dies 204 have a maximum operating temperature of about 105° C. This concentration of heat can cause the logic die 201 as well as adjacent memory dies 204 to exceed their maximum operating temperature ($T_{max}$). This can especially be the case for newer generation HMC assemblies, which can have a logic core power of, e.g., about 14 W (vs., e.g., about 4 W for earlier generation HMC assemblies).

Figure 2B:
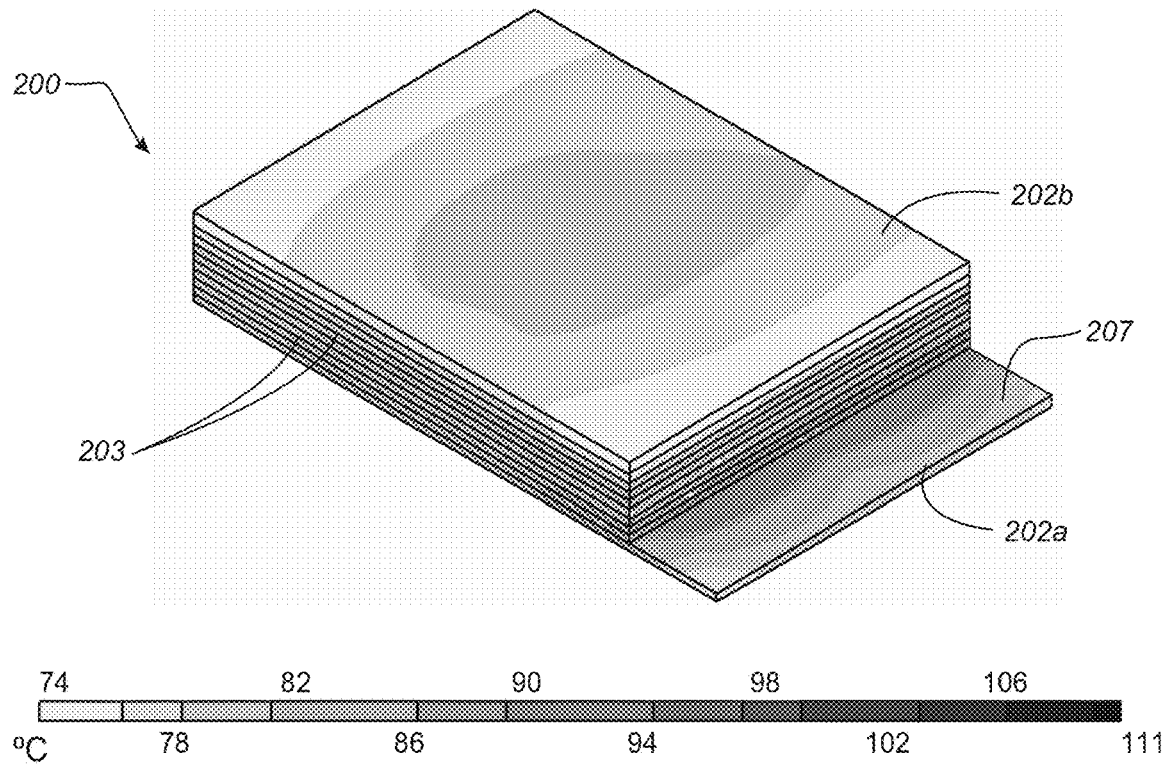
FIG. 2B is a an isometric view illustrating a temperature profile of a HMC assembly in accordance with an embodiment of the present technology.

Semiconductor die assemblies configured in accordance with embodiments of the present technology are expected to reduce the flow of heat through the memory dies. FIG. 2B, for example, is an isometric view illustrating a temperature profile of a HMC assembly 200 during operation in accordance with the present technology. The HMC assembly 200 includes a stack of memory dies 203 disposed between a first logic die 202a and a second logic die 202b. As shown, the first logic die 202a dissipates a majority of its heat toward a peripheral portion 207. For example, the peripheral portion 207 can dissipate heat directly to the wall portion 113 of the casing 110 (FIG. 1). The second logic die 202b, on the other hand, dissipates a majority of its heat toward the top of the assembly. For example, the second logic die 202b can dissipate heat directly to the cap portion 112 of the casing 110 (FIG. 1). As a result, the maximum temperature of the first logic die 202a is lower than the maximum temperature of the logic die 201 of the HMC assembly 290 (e.g., 96° C. vs. 111° C.). Also, the maximum temperature of the memory dies 203 is lower than the maximum operation temperature of the memory dies 204 (e.g., 91° C. vs. 96° C.). As a result, the logic and memory dies 202 and 203 of the HMC assembly 200 can operate within a more acceptable temperature range and below maximum temperature specifications.

Figure 2C:
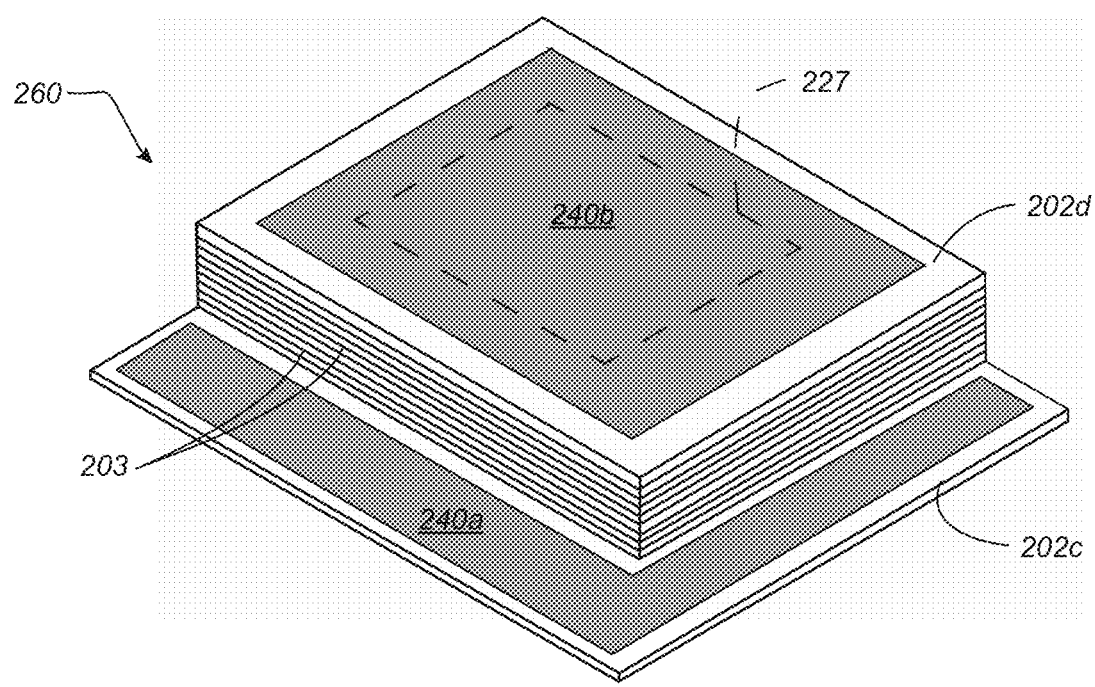
FIG. 2C is an isometric view illustrating a semiconductor die assembly configured in accordance with another embodiment of the present technology.

In general, the logic dies of a semiconductor die assembly can include integrated circuit components having any of a variety of arrangements for dissipating heat throughout a semiconductor die assembly. FIG. 2C, for example, shows a semiconductor die assembly 260 having a logic die 202c below the stack of memory dies 203 and a logic die 202d on top of the stack of memory dies 203. The logic die 202c can include first integrated circuit components 240a (shown schematically) concentrated toward the periphery of the logic die 202c, and the logic die 202d can include second integrated circuit components 240b (shown schematically) formed across substantially the entire logic die 202d. In another embodiment, the second integrated circuit components 240b can be offset from the periphery of the logic die 202d and disposed more centrally (as shown by the superimposed footprint 227). In various embodiments, integrated circuit components can also be configured to produce different amounts of heat. For example, the integrated circuit components of a top-most logic die can produce more than 50% of the logic-related heat (e.g., about 75% or more of the heat), while the bottom-most logic die can produce less than 50% of the logic-related heat (e.g., about 25% or less of the heat). Alternately, the integrated circuit components of the top-most logic die can produce less heat than the circuit components of the bottom-most logic die.

Figure 3:
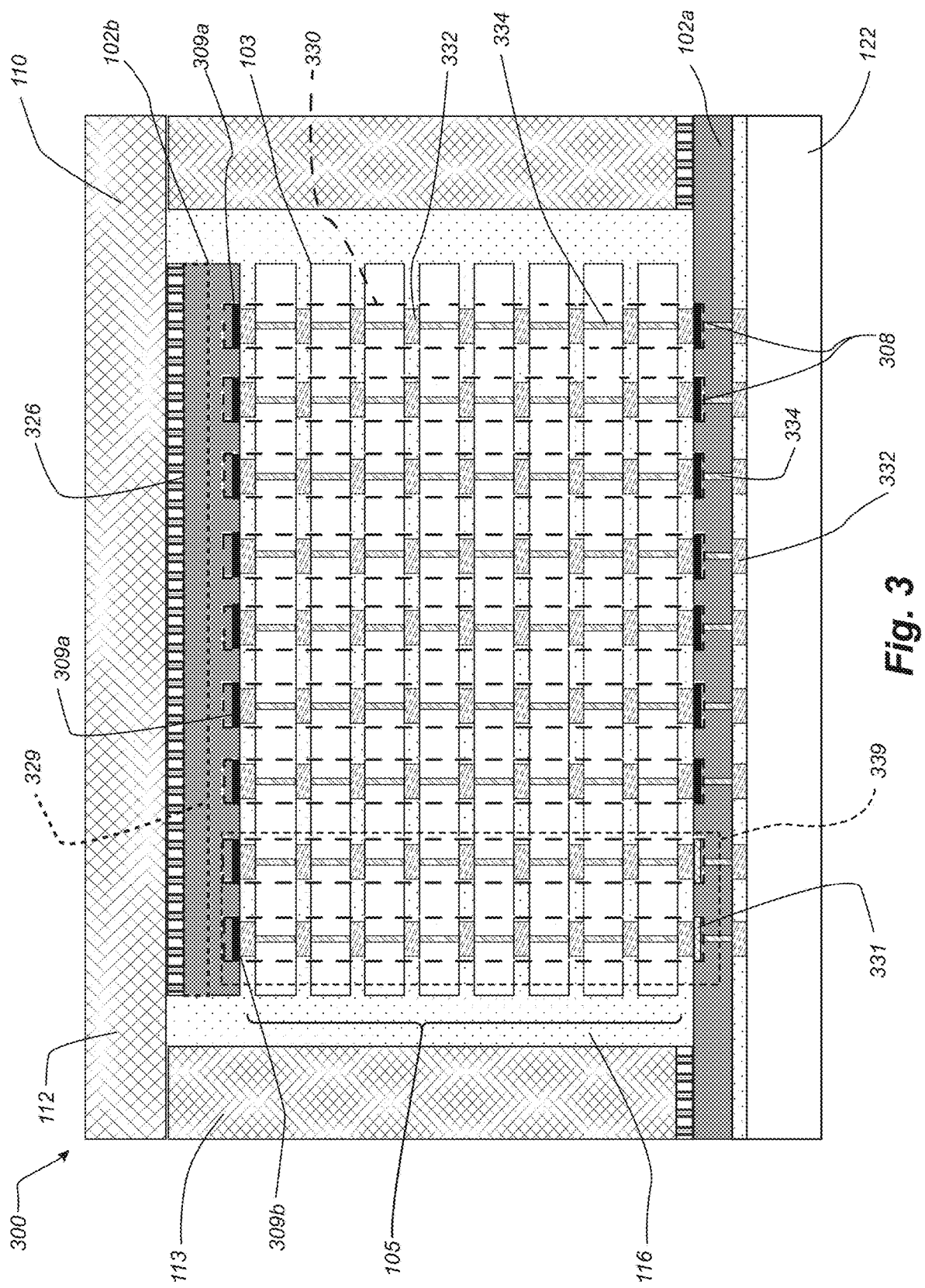
FIG. 3 is a cross-sectional view of a semiconductor die assembly configured in accordance with another embodiment of the present technology.

FIG. 3 is a cross-sectional view of a semiconductor die assembly 300 ("assembly 300") configured in accordance with another embodiment of the present technology. The assembly 300 can include features generally similar to those of the assembly 100 described in detail above. For example, the assembly 300 can include the memory die stack 105 positioned between the logic dies 102. In the illustrated embodiment of FIG. 3, the first logic die 102a, the second logic die 102b, and each of the memory dies 103 are electrically coupled to one another by a plurality of electrical connectors or interconnects 332 (e.g., copper pillars, solder bumps, conductive traces, contact pads, etc.). The first logic die 102a and the individual memory dies 103 can each include a plurality of through-die interconnects 334 (e.g., through-substrate vias, TSVs, etc.) that are coupled on opposite sides to the interconnects 332. The interconnects and the through-die interconnects 332 and 334 can be formed from various types of conductive materials (e.g., metallic materials), such as copper, nickel, aluminum, etc. In some embodiments, the conductive materials can include solder (e.g., SnAg-based solder), conductor-filled epoxy, and/or other electrically conductive materials. In selected embodiments, for example, the interconnects 332 can be copper pillars, whereas in other embodiments the interconnects 332 can include more complex structures, such as bump-on-nitride structures. In other embodiments, the interconnects 332 can be replaced with other types of materials or structures, such as a conductive paste.

In one aspect of this embodiment, the second logic die 102b can be formed without through-die interconnects because it is disposed toward the top of the assembly 100 rather than the bottom of the assembly. For example, conventional semiconductor die packages have a single logic die disposed between the package substrate and the memory die stack. This arrangement can require the logic die to have through-die interconnects to electrically connect the package substrate with the memory die stack. This arrangement can also require the logic die to be thin to reduce the vertical length and the aspect ratio of the through-die interconnects. For example, logic dies (or the substrates used to form the logic dies) can be thinned to size by backgrinding, etching, and/or chemical mechanical polishing (CMP). One advantage, therefore, with having the second logic die 102b at the top of the assembly 100 is that the second logic die 102b can be formed with fewer manufacturing steps than the first logic die 102a. For example, the second logic die 102b can be formed without substrate thinning, through-hole etching, and metal deposition processes for forming through-die interconnects. In several embodiments, the second logic die 102b can have a thickness in the range of about 300 μm to about 1000 μm (e.g., 350 μm) and the other dies in the assembly 100 can have a thickness in the range of about 50 to about 200 μm (e.g., 100 μm).

In another aspect of this embodiment, the second logic die 102b includes a bulk portion 329 of the semiconductor substrate that would ordinarily be removed from the second logic die 102b when forming through-die interconnects. In several embodiments, the bulk portion 329 can facilitate heat conduction away from the assembly 300 and through the cap portion 112 of the casing 110. In another embodiment, the casing 110 can be omitted from the assembly 300 such that an outermost surface 326 of the assembly 300 is exposed. In an alternate embodiment, the outermost surface 326 can be covered with the underfill material 116 and/or another material (e.g., an encapsulant of a package casing).

In addition to electrical communication, the interconnects and the through-die interconnects 332 and 334 can serve as conduits through which heat can be transferred away from the memory die stack 105 and toward the casing 110. In some embodiments, the assembly 100 can also include a plurality of thermally conductive elements or "dummy elements" (not shown) positioned interstitially between the interconnects 332 to further facilitate heat transfer away from the logic dies 102 and the memory dies 103. Such dummy elements can be at least generally similar in structure and composition as the interconnects 332 except that they are not electrically coupled to the logic dies 102 and the memory dies 103.

In the illustrated embodiment, a plurality of through-stack interconnects 330 couple bond pads 308 of the first logic die 102a with corresponding bond pads 309 of the second logic die 102b. As discussed above, the through-stack interconnects 330 can each be composed of a collective portion of the interconnects 332 and the through-die interconnects 334. In some embodiments, a portion 339 of the through-stack interconnects 330 can be functionally isolated from the first logic die 102a. For example, the portion 339 of the through-stack interconnects 330 can be connected to "dummy" contact pads 331 at the first logic die 102a that are functionally isolated from the integrated circuit components (not shown) of the first logic die 102a.

Figure 4:
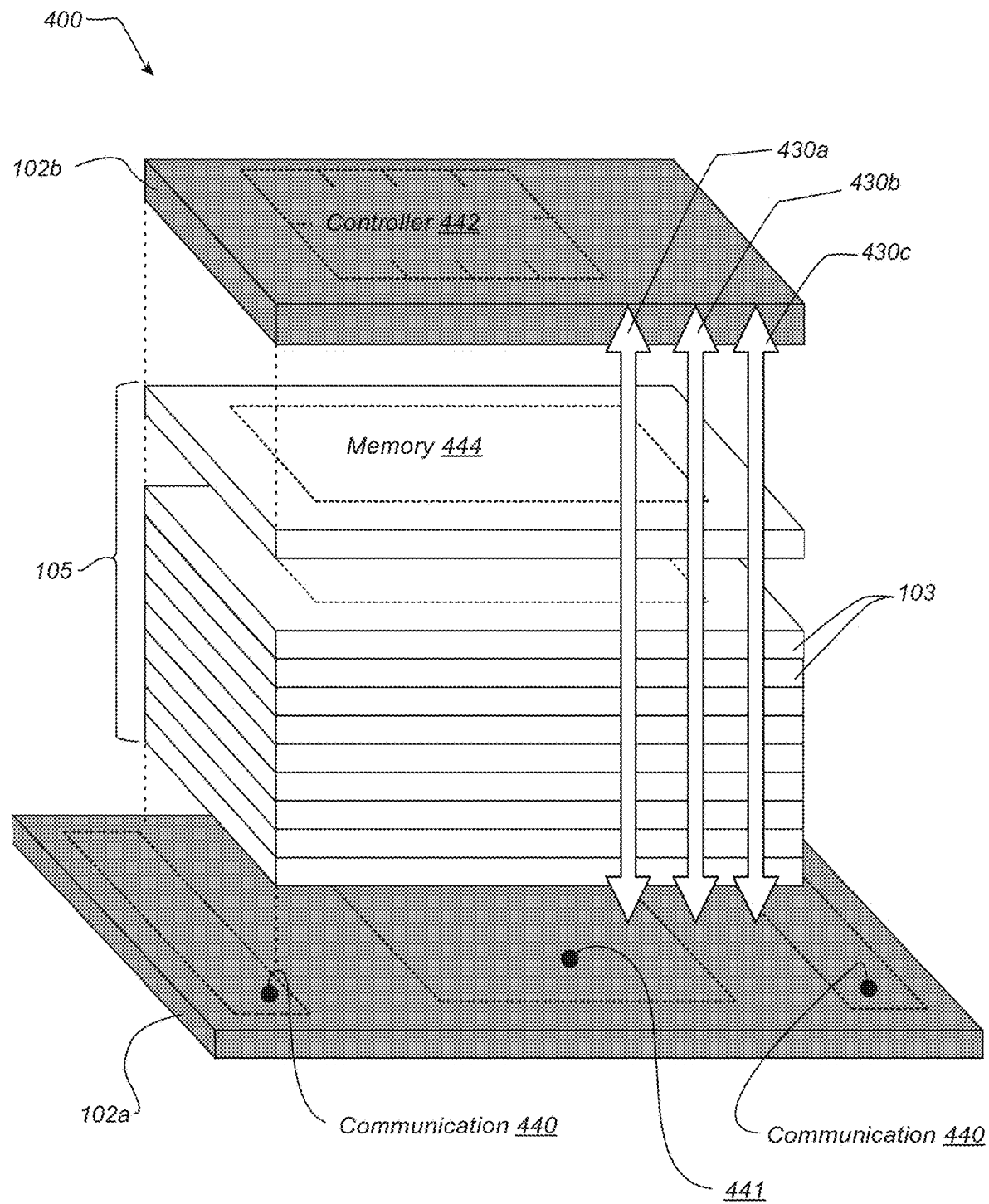
FIG. 4 is a schematic view of a semiconductor die assembly having integrated circuit components configured in accordance with an embodiment of the present technology.

FIG. 4 is a schematic view of a semiconductor die assembly ("assembly 400") having integrated circuit components configured in accordance with an embodiment of the present technology. The assembly 400 can include features generally similar to those of the die assemblies described in detail above. For example, the assembly 400 can include the memory die stack 105 disposed between the first logic die 102a and a second logic die 102b. In the illustrated embodiment, the first logic die 102a includes communication components 440 coupled to the package contacts 124 of the package substrate 120 (FIG. 1) The second logic die 102b can include memory controller components 442 ("memory controller 442") coupled to the communication components 440 by one or more first through-stack interconnects (schematically represented by double-sided arrow 430a). Each of the memory dies 103 can include a plurality of memory cells (not shown) arranged in one or more arrays and/or memory blocks of memory ("memory 444"). The memory 444 of the individual memory dies 103 is coupled to the memory controller 442 by one or more second through-stack interconnects (schematically represented by double-sided arrow 430b).

In one aspect of this embodiment, the communication components 440 are arranged toward the outer periphery of the first logic die 102a to dissipate heat to the wall portion 113 of the casing 110 (FIG. 1). The memory controller 442, on the other hand, is positioned at the top of the assembly 100 to dissipate heat to the cap portion 112 of the casing 110 (FIG. 1). In some embodiments, however, the communication components 440 and/or the memory controller 442 can be positioned differently within the assembly 400. For example, in several embodiments the communication components 440 can be located at more than two sides of the memory die stack 105. In other embodiments, the communication components 440 can be located at a single side of the memory die stack 105. Further, in certain embodiments, the communication components 440 can extend beneath the memory die stack 105.

In several embodiments, the first logic die 102a and/or the second logic die 102b can include additional and/or alternative integrated circuit components. For example, in the illustrated embodiment, the first logic die 102a includes additional circuit components 441 beneath the memory die stack 105 (e.g., power distribution components, clock circuits, etc.). In several embodiments, the additional circuit components 441 can have lower operating temperatures than the communication components 440. In one embodiment, the additional circuit components 441 can be coupled to the second logic die 102b by third through-stack interconnects (schematically represented by double-sided arrow 430c). In another embodiment, the additional circuit components 441 can also be coupled to the second logic die 102b by the first through-stack interconnects 430a and/or the second through-stack interconnects 430b. Alternately, the first through-stack interconnects 430a and/or the second through-stack interconnects 430b can be dedicated circuit paths that are not connected to the additional circuit components 441. Moreover, although not illustrated in the Figures for purposes of clarity, each of the communication components 440, the memory controller 442, and/or the memory 444 can include a variety of circuits elements. For example, these circuit components can include multiplexers, shift registers, encoders, decoders, driver circuits, amplifiers, buffers, registers, filters (e.g., low pass, high pass, and/or band pass filters), etc.

Figure 5:
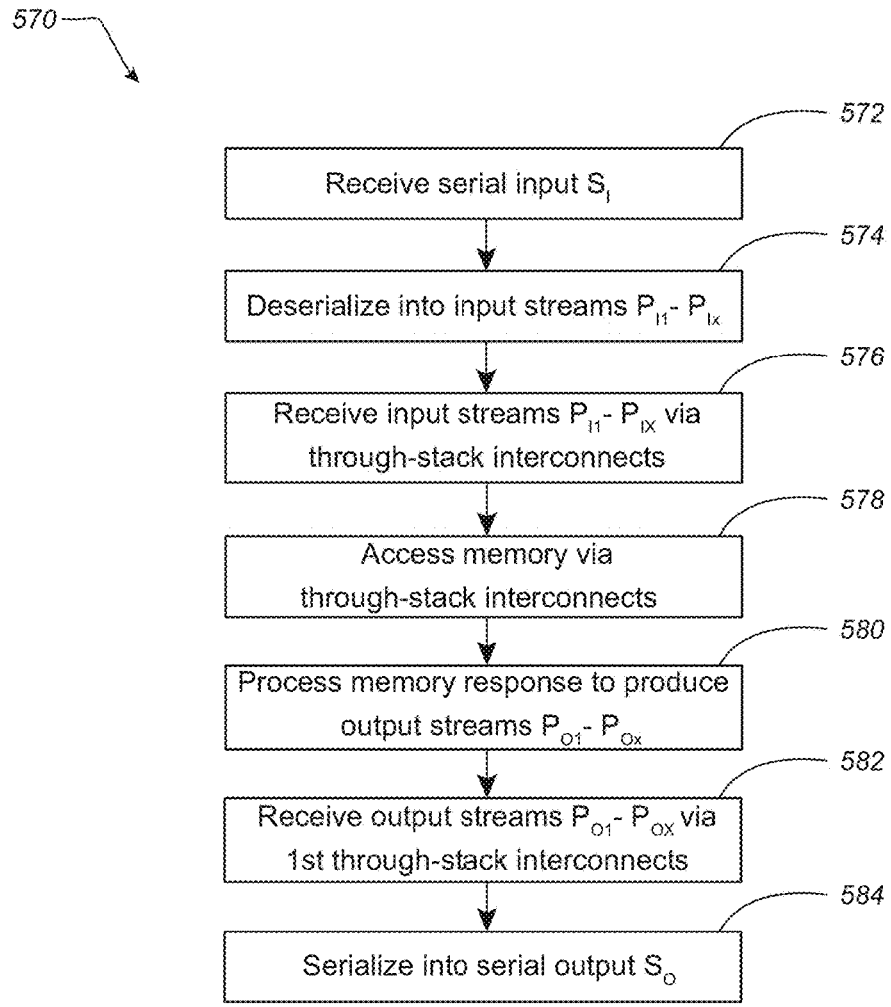
FIG. 5 is a flow diagram illustrating a method for operating a semiconductor die assembly in accordance with an embodiment of the present technology.

FIG. 5 is a flow diagram illustrating a method 570 for operating a semiconductor die assembly in accordance with an embodiment of the present technology. In several embodiments, the method 570 can be employed for operating the die assemblies described in detail above. At block 572, the communication components 440 (FIG. 3) receive an input stream of serial data $S_I$ ("serial input $S_I$") from the package contacts 124 (FIG. 1). The serial input $S_I$ can contain, for example, data and instructions to store the data. In addition or alternately, the serial input $S_I$ can contain instructions to read data and/or erase data. At block 574, the communication components 440 deserializes the serial input $S_I$ into a plurality of input streams $P_{I1}$-$P_{IX}$. In several embodiments, the communication components 440 can include one or more serializer/deserializer circuits (known to those skilled in the art as "SerDes" circuits) configured to convert a serial flow of data into a parallel flow of data (and vice versa). For example, serializer/deserializer circuits can both produce and convert parallel data flows having multiple signal components (e.g., four component signals, eight component signals, sixteen component signals, etc.).

At block 576, the memory controller 442 (FIG. 3) receives the input streams $P_{I1}$-$P_{IX}$ over the first through-stack interconnects. For example, the memory controller can receive the first input stream $P_{I1}$ over a portion of the through-stack interconnects 130 (FIG. 1) while simultaneously or near simultaneously receiving the other input streams $P_{I2}$-$P_{IX}$ over another portion of the through-stack interconnects 130. At block 578, the memory controller 442 processes the input streams $P_{I1}$-$P_{IX}$ and then selects and accesses certain memory via the second through-stack interconnects. For example, the memory controller 442 can select and access the memory 444 (FIG. 3) of one or more of the memory dies 103 by encoding instructions along with a memory address to retrieve, store, and/or erase data.

At block 580, the memory controller 442 processes a response received from the selected memory into a plurality of output streams $P_{O1}$-$P_{OX}$. The response can include, for example, requested data, a confirmatory response, and/or other information (e.g., an error response if data cannot be read or written) from the selected memory. At block 582, the communication components 440 receive the plurality of output streams $P_{O1}$-$P_{OX}$ over at least a portion of the first through-stack interconnects. At block 584, the communication components 440 then serialize the output streams $P_{O1}$-$P_{OX}$ into an output serial data stream $S_O$ ("serial output $S_O$") that can be output to the package contacts 124.

Figure 6:
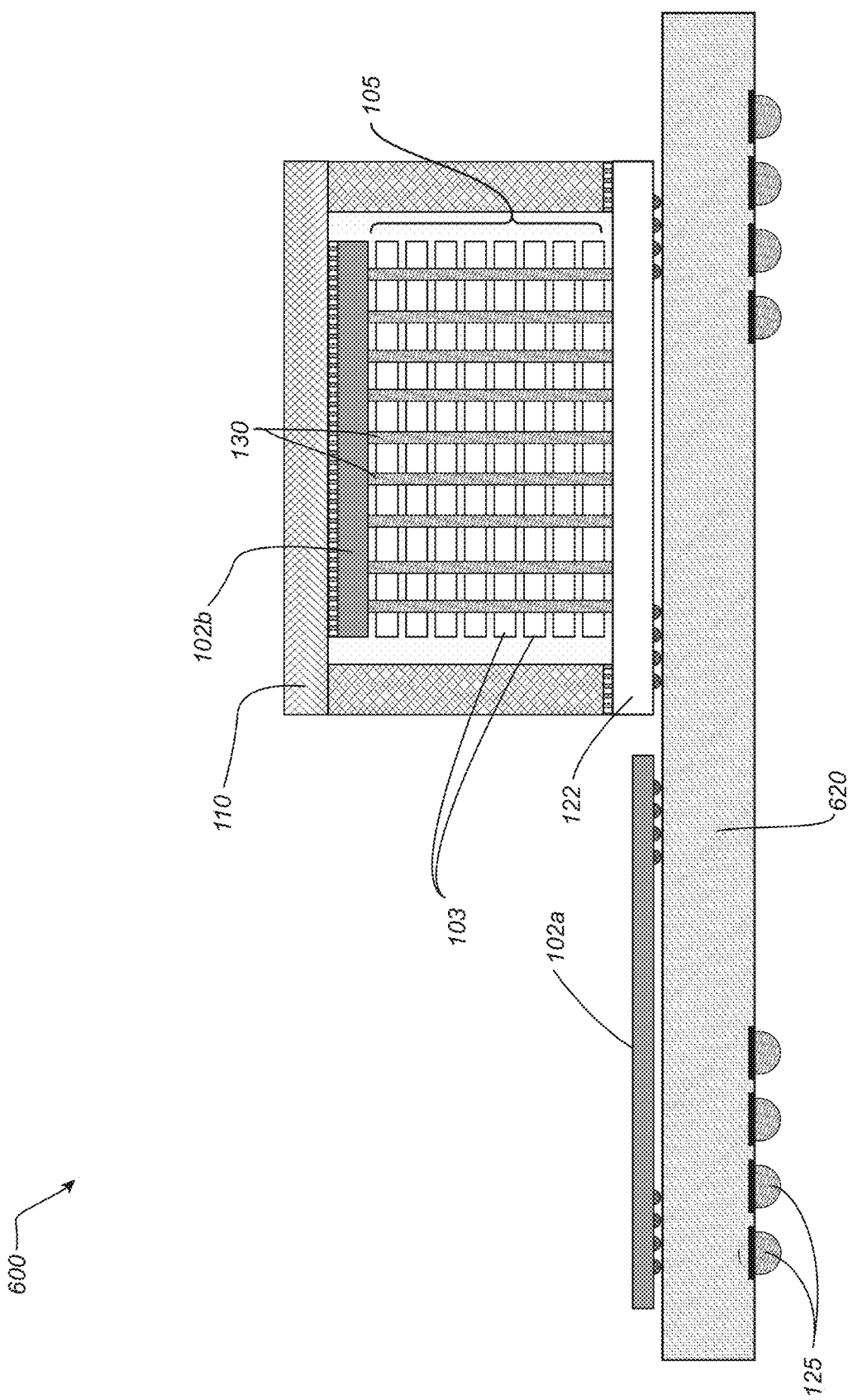
FIG. 6 is a cross-sectional view of a semiconductor die assembly configured in accordance with another embodiment of the present technology.

FIG. 6 is a cross-sectional view of a semiconductor die assembly 600 ("assembly 600") configured in accordance with another embodiment of the present technology. The assembly 600 can include features generally similar to those of the die assemblies described in detail above. For example, the assembly 600 includes the memory die stack 105 and the second logic die 102b enclosed within the casing 110. In the illustrated embodiment of FIG. 6, however, the first logic die 102a is not attached to the memory die stack 105. Rather, the first logic die 102a is mounted to a different location on a support substrate 620 (e.g., a printed circuit board). Accordingly, the first logic die 102a is electrically coupled to the second logic die 102b through communication paths that extend through the support substrate 620, the interposer 122, and the through-stack interconnects 130. In this embodiment, the heat produced by the first logic die 102a does not dissipate through the memory die stack 105 or the second logic die 102b and thus the memory dies 103 and the second logic die 102b can have lower operating temperatures.

Figure 7:
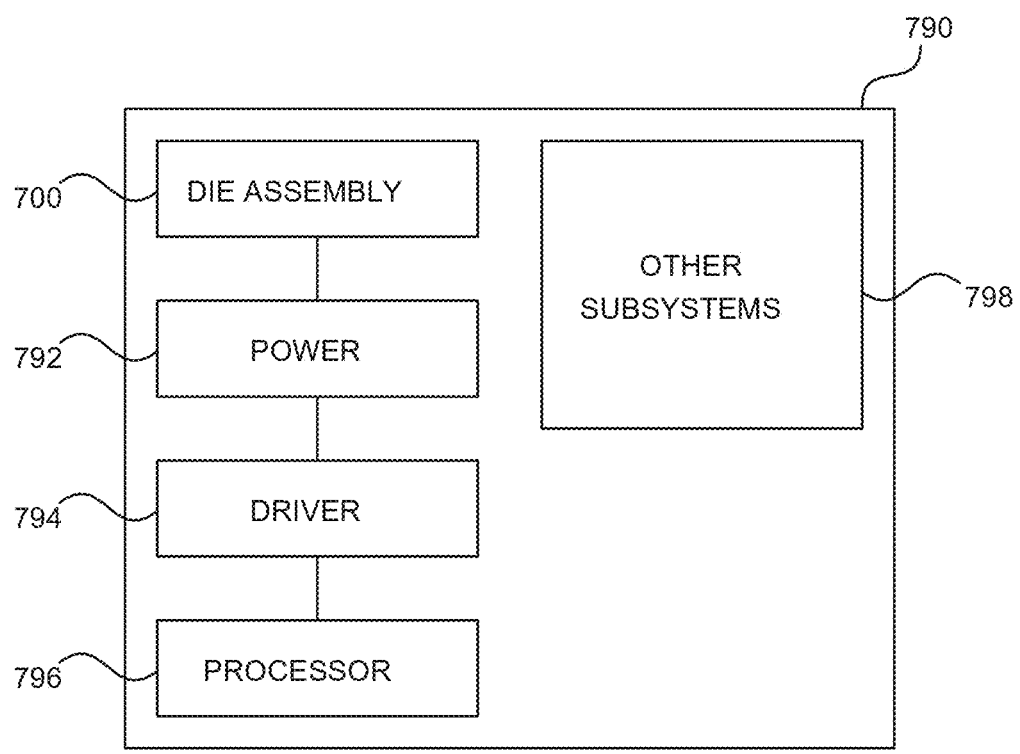
FIG. 7 is a schematic view of a system that includes a semiconductor die assembly configured in accordance with embodiments of the present technology.

Any one of the stacked semiconductor die assemblies described above with reference to FIGS. 1-6 can be incorporated into any of a myriad of larger and/or more complex systems, a representative example of which is system 790 shown schematically in FIG. 7. The system 790 can include a semiconductor die assembly 700, a power source 792, a driver 794, a processor 796, and/or other subsystems or components 798. The semiconductor die assembly 700 can include features generally similar to those of the stacked semiconductor die assemblies described above. The resulting system 790 can perform any of a wide variety of functions, such as memory storage, data processing, and/or other suitable functions. Accordingly, representative systems 790 can include, without limitation, hand-held devices (e.g., mobile phones, tablets, digital readers, and digital audio players), computers, and appliances. Components of the system 790 may be housed in a single unit or distributed over multiple, interconnected units (e.g., through a communications network). The components of the system 790 can also include remote devices and any of a wide variety of computer readable media.

From the foregoing, it will be appreciated that specific embodiments of the technology have been described herein for purposes of illustration, but that various modifications may be made without deviating from the disclosure. For example, although many of the embodiments of the semiconductor dies assemblies are described with respect to HMCs, in other embodiments the semiconductor die assemblies can be configured as other memory devices or other types of stacked die assemblies. Certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor die assembly, comprising:
    a first logic die including a memory controller;
    a second logic die including—
        a central portion beneath a footprint of the first logic die;
        a peripheral portion extending beyond the footprint of the first logic die;
        a circuit component disposed in the central portion; and
        a communication component disposed in the peripheral portion and configured to deserialize serial input data into a plurality of input data streams, wherein the circuit component has a lower operating temperature than the communication component;
    a stack of memory dies positioned on the second logic die, wherein the first logic die is positioned on the stack of memory dies;
    a plurality of first through-stack interconnects extending through the entire stack of memory dies to couple the memory controller to the communication component, wherein the first through-stack interconnects are configured to transmit (a) the plurality of input data streams from the communication component to the memory controller and (b) a plurality of output data streams from the memory controller to the communication component;
    a plurality of second through-stack interconnects extending through the entire stack of memory dies to couple the first logic die to the circuit component; and
    a thermally conductive casing having a cap portion over the first logic die and a wall portion extending from the cap portion, wherein the wall portion is attached to the peripheral portion of the second logic die and configured to dissipate heat from the communication component during operation.

2. The semiconductor die assembly of claim 1 wherein the first logic die includes a bulk portion of a semiconductor substrate, and wherein the bulk portion is configured to facilitate heat conduction to the cap portion of the thermally conductive casing.

3. The semiconductor die assembly of claim 2 wherein the first logic die has a thickness of about 300 μm to about 1000 μm, and wherein the second logic die has a thickness of about 50 μm to about 200 μm.

4. The semiconductor die assembly of claim 2, further comprising:
    a first thermal interface material attaching the bulk portion of the first logic die to the cap portion of the thermally conductive casing; and
    a second thermal interface material attaching the peripheral portion of the second logic die to the wall portion of the thermally conductive casing.

5. The semiconductor die assembly of claim 1, further comprising a plurality of third through-stack interconnects extending through the entire stack of memory dies between the first and the second logic dies, wherein the third through-stack interconnects are functionally isolated from the communication component and the circuit component.

6. The semiconductor die assembly of claim 5 wherein the third through-stack interconnects are functionally isolated from the memory dies.

7. The semiconductor die assembly of claim 1, further comprising a plurality of thermally conductive dummy elements positioned interstitially between the first through-stack interconnects.

8. The semiconductor die assembly of claim 1, further comprising a plurality of third through-stack interconnects extending at least partially through the stack of memory dies, wherein each of the memory dies is coupled to the memory controller via one or more of the third through-stack interconnects.

9. The semiconductor die assembly of claim 1 wherein the circuit component is a power distribution component.

10. The semiconductor die assembly of claim 1 wherein the circuit component is a clock circuit.

11. The semiconductor die assembly of claim 1 wherein the communication component includes a serial/deserializer circuit.

12. The semiconductor die assembly of claim 1 wherein the cap and wall portions of the thermally conductive casing define a cavity, wherein the stack of memory dies is disposed within the cavity, and further comprising a dielectric underfill material encapsulating the first logic die, the second logic die, and the stack of memory dies, wherein the dielectric underfill material contacts the thermally conductive casing.

13. A method of forming a semiconductor die assembly, the method comprising:
    disposing a stack of memory dies on a central portion of a first logic die, wherein the first logic die includes (a) a circuit component in the central portion and (b) a communication component in a peripheral portion that is outside the central portion, wherein the communication component is configured to deserialize serial input data into a plurality of input data streams, and wherein the circuit component has a lower operating temperature than the communication component;

disposing a second logic die on the stack of memory dies, wherein the second logic die includes a memory controller;

forming a plurality of first through-stack interconnects through the entire stack of memory dies to electrically couple the memory controller to the communication component, wherein the first through-stack interconnects are configured to transmit (a) the plurality of input data streams from the communication component to the memory controller and (b) a plurality of output data streams from the memory controller to the communication component;

forming a plurality of second through-stack interconnects through the entire stack of memory dies to electrically couple the second logic die to the circuit component;

coupling a wall portion of a thermally conductive casing to the peripheral portion of the first logic die; and coupling a cap portion of the thermally conductive casing to the second logic die.

14. The method of claim 13 wherein the second logic die includes a bulk portion of a semiconductor substrate, and wherein coupling the cap portion of the thermally conductive casing to the second logic die includes coupling the cap portion to the bulk portion.

15. The method of claim 13 wherein the method does not include forming through-die interconnects through the second logic die.

16. The method of claim 13 wherein the method further includes forming a plurality of third through-stack interconnects (a) through the entire stack of memory dies and (b) to be functionally isolated from the communication component and the circuit component.

17. The method of claim 16 wherein forming the plurality of third through-stack interconnects includes forming the third through-stack interconnects to be functionally isolated from the memory dies.

18. The method of claim 13 wherein the method further includes forming a plurality of thermally conductive dummy elements interstitially between the first through-stack interconnects.

19. The method of claim 13 wherein the method further includes forming a plurality of third through-stack interconnects at least partially through the stack of memory dies to electrically couple each of the memory dies to the memory controller.

20. A semiconductor die assembly, comprising:
a first logic die including a memory controller, wherein the first logic die includes a bulk portion of a semiconductor substrate;
a second logic die including—
  a central portion beneath a footprint of the first logic die;
  a peripheral portion extending beyond the footprint of the first logic die;
  a circuit component disposed in the central portion, wherein the circuit component is a clock circuit or a power distribution component; and
  a communication component disposed in the peripheral portion and configured to deserialize serial input data into a plurality of input data streams, wherein the circuit component has a lower operating temperature than the communication component;
a stack of memory dies positioned on the second logic die, wherein the first logic die is positioned on the stack of memory dies;
a plurality of first through-stack interconnects extending through the entire stack of memory dies to couple the memory controller to the communication component, wherein the first through-stack interconnects are configured to transmit (a) the plurality of input data streams from the communication component to the memory controller and (b) a plurality of output data streams from the memory controller to the communication component;
a plurality of second through-stack interconnects extending through the entire stack of memory dies to couple the first logic die to the circuit component;
a plurality of third through-stack interconnects extending at least partially through the stack of memory dies, wherein each of the memory dies is coupled to the memory controller via one or more of the third through-stack interconnects; and
a thermally conductive casing having a cap portion and a wall portion extending from the cap portion, wherein the wall portion is attached to the peripheral portion of the second logic die and configured to dissipate heat from the communication component during operation, and wherein the cap portion is attached to the bulk portion of the first logic die to dissipate heat from the memory controller and the stack of memory dies during operation.

* * * * *